United States Patent
Bell et al.

(10) Patent No.: US 6,763,470 B1
(45) Date of Patent: Jul. 13, 2004

(54) SYSTEM AND METHOD FOR DYNAMICALLY AMPLIFYING A DELAYED ANALOG SIGNAL BASED ON AMPLITUDE INFORMATION OBTAINED FROM ITS DIGITAL REPRESENTATION

(75) Inventors: Russell W. Bell, Freehold, NJ (US); Luke J. Smithwick, Monmouth Beach, NJ (US)

(73) Assignee: Globespanvirata, Inc., Red Bank, NJ (US)

(*) Notice: Subject to any disclaimer, the term of this patent is extended or adjusted under 35 U.S.C. 154(b) by 0 days.

(21) Appl. No.: 09/575,489

(22) Filed: May 19, 2000

Related U.S. Application Data

(60) Provisional application No. 60/134,914, filed on May 19, 1999.

(51) Int. Cl.[7] .............................. G06F 1/32; H03G 3/00
(52) U.S. Cl. ........................ 713/320; 713/300; 713/310; 713/323; 713/324; 330/254; 330/278; 330/279; 330/280; 330/127
(58) Field of Search ................................. 713/300, 310, 713/320, 323, 324; 330/254, 278, 279, 280, 281, 127, 129, 130, 131, 133, 135, 136, 51; 327/58, 59, 60, 62, 91, 140, 306; 455/127.1, 127.2, 127.3, 127.4, 127.5, 541

(56) References Cited

U.S. PATENT DOCUMENTS 5,053,770 A * 10/1991 Mayer et al. ................ 341/118
5,256,987 A * 10/1993 Kibayashi et al. .......... 330/295

(List continued on next page.)

FOREIGN PATENT DOCUMENTS

JP   04127758 A   * 4/1992   ............ H04M/3/42

OTHER PUBLICATIONS

Adel S. Sedra and Kenneth C. Smith, Microelectronic Circuits, 1991, Saunderss College Publishing, pp. 742–747.*

(List continued on next page.)

Primary Examiner—Lynne H. Browne
Assistant Examiner—James K. Trujillo
(74) Attorney, Agent, or Firm—Thomas, Kayden, Horstemeyer & Risley

(57) ABSTRACT

The present invention is directed to a signal processing and amplifying system that uses advance knowledge of a digital signal, before it is converted to analog form and applied to the input stage of the amplifier stage, to "intelligently" amplify the signal with the maximum power efficiency and minimal distortion. This advance knowledge of the digital signal allows a switch control logic (SCL) unit to open and close solid state switches and seamlessly turn off and on the low and high power stages correctly to minimize the amplifier distortion while conserving power. In one embodiment, the system comprises a shift register, which receives the supplied digital signal to be amplified and delays the digital signal by a known amount, a digital to analog converter, an amplifying circuit, which is made up of at least two amplifiers, and an SCL unit. The SCL unit comprises control logic, and multiple solid state switches. The SCL unit monitors the digital signal determine when to activate/deactivate amplifier stages and open/close switches for the most power efficient operation. This system and method efficiently amplifies signals with low distortion due to the intelligent use of solid state switches, via the SCL unit to monitor exactly when to enable/disable amplifier stages. This system achieves low distortion and power efficient amplification—necessary to a variety of systems from cellular phones, mobile electronics, and high-density line cards for DSL and other communications services.

26 Claims, 4 Drawing Sheets

U.S. PATENT DOCUMENTS

| | | | | |
|---|---|---|---|---|
| 5,834,975 A | * | 11/1998 | Bartlett et al. | 330/278 |
| 5,872,481 A | * | 2/1999 | Sevic et al. | 330/51 |
| 5,898,342 A | | 4/1999 | Bell | 330/297 |
| 5,923,213 A | * | 7/1999 | Darthenay et al. | 330/51 |
| 6,215,987 B1 | * | 4/2001 | Fujita | 455/127.3 |
| 6,281,944 B1 | * | 8/2001 | Kim | 348/674 |
| 6,353,364 B1 | * | 3/2002 | Klemmer | 327/112 |
| 6,463,269 B2 | * | 10/2002 | DeMarco | 455/341 |
| 6,567,476 B2 | * | 5/2003 | Kohl et al. | 375/293 |
| 6,615,028 B1 | * | 9/2003 | Loke et al. | 455/127.1 |

OTHER PUBLICATIONS

Elwan, H.O.; Ismail, M.; "Low voltage digitally controlled dB–linear CMOS VGA circuit for wireless communication", Electronics Circuits and Systems, 1998 IEEE International Conference on, vol.: 1, Sep. 7–10, 1998, pp. 341–344 vol. 1.*

Tripath, Technical Information—AN1, "Class T Digital Audio Amplifier Technology Overview", Apr. 12, 1999.

* cited by examiner

SYSTEM AND METHOD FOR DYNAMICALLY AMPLIFYING A DELAYED ANALOG SIGNAL BASED ON AMPLITUDE INFORMATION OBTAINED FROM ITS DIGITAL REPRESENTATION

CROSS REFERENCE TO RELATED APPLICATIONS

This application claims the benefit of U.S. Provisional Patent Application No. 60/134,914, filed May 19, 1999, which is incorporated herein by reference in its entirety

FIELD OF INVENTION

This invention generally relates to power amplifiers, and more particularly to a dynamically switched power amplifier having improved power efficiency.

BACKGROUND OF INVENTION

Over recent years, many technological advances have been made allowing the general public access to mobile communication devices such as PCS and digital cellular systems. Unfortunately, these systems suffer from one major drawback: power consumption.

Although much improved over recent years, power consumption has remained one of the central issues facing the mobile communications market. Excessive power consumption reduces the usability of these devices due to the down time for recharging the batteries, etc. Conversely, lower power consumption directly translates into longer battery life and less recharging downtime.

Another technology area in which power conception is important is the area of high-speed data communications products. In this area, there are a number of issues related to power consumption, including: (1) the actual costs of the power consumed by communications systems, (2) the challenges associated with the dissipation of excessive power consumption, which may include forced air cooling, convection cooling, additional heat sinks, etc. and (3) excessive heat resulting from high power consumption limits the circuit density, thus requiring additional space for a communications networking system. This may force an Internet service provider (ISP) or an enterprise networking system to seek additional space to house power-hungry equipment.

Power consumption reductions are partially addressed by advances in semiconductor processes along with transistor geometries which "shrink" over time, thus reducing switching capacitance and supply voltages, which in turn reduces the overall power consumption of digital integrated circuits Furthermore, multiple functions are now often placed on a single chip, eliminating external buses and their associated connections.

To date, similar advances have not been made in the analog domain. Attempts have been made, however, to reduce power consumption of the analog devices. These include linear amplifiers that typically are used for a variety of communications functions such as cellular phones and xDSL systems. A variety of amplifier techniques, or "classes," have been developed over the years in an attempt to optimize amplifiers for particular applications. These amplifier classes are referred to as class A, B, AB, D, G, and H amplifiers. The structure and/or characteristics of amplifiers in these classes will be understood by persons skilled in the art, and need not be described herein. Suffice it to say that each amplifier class has unique advantages.

Class A, B, and AB operate during a specific amount of the signal time and may be configured in a manner that minimizes distortion while lowering power consumption. Class D, G, and H have been designed to improve the power efficiency even more, at the expense of additional distortion. Class D amplifiers uses switching transistors and pulse width modulation to "digitize" a signal and then "reintegrate" it to reconstruct the signal. Unfortunately, these amplifiers may have extremely poor audio response and introduce much distortion to the signal, particularly at the high frequencies associated with xDSL and other communications signals. Class G amplifiers use multiple voltage rails to efficiently amplify signals with a large dynamic range. Careful selection of the ratio of power supply rails along with the number of supply voltages in a class G amplifier can result in a relative efficient amplifier for certain types of signals. Class H amplifiers yield results similar to class G but rely on continuously variable voltage rails in response to the input signal, to optimize the efficiency and distortion of the amplifier.

In view of the foregoing, it would be advantageous to have an amplifying system that was power efficient while exhibiting minimal distortion.

SUMMARY OF INVENTION

The present invention is directed to a signal processing and amplifying system that uses advance knowledge of a digital signal, before it is converted to analog form and applied to the input stage of the amplifier stage, to "intelligently" amplify the signal with the maximum power efficiency and minimal distortion. This advance knowledge of the digital signal allows a switch control logic (SCL) unit to open and close solid state switches and seamlessly turn off and on the low and high power stages correctly to minimize the amplifier distortion while conserving power.

The system comprises a shift register, which receives the supplied digital signal to be amplified and delays the digital signal by a known amount, a digital to analog converter, an amplifying circuit, which is made up of at least two amplifiers, and an SCL unit. The SCL unit comprises control logic, and multiple solid state switches. The SCL unit monitors the digital signal to determine when to activate/deactivate amplifier stages and open/close switches for the most power efficient operation.

This system and method efficiently amplifies signals with low distortion due to the intelligent use of solid state switches, via the SCL unit to monitor exactly when to enable/disable amplifier stages. This system achieves low distortion and power efficient amplification—necessary to a variety of systems from cellular phones, mobile electronics, and high-density line cards for DSL and other communications services.

BRIEF DESCRIPTION OF DRAWINGS

The above and further features, advantages, and benefits of the present invention will be apparent upon consideration of the followed detailed description, taken in conjunction with the accompanying drawings, in which the like reference characters refer to like parts throughout, and in which.

DETAILED DESCRIPTION OF THE PREFERRED EMBODIMENTS

The following description is of the best mode presently contemplated for practicing the invention. This description is not to be taken in a limiting sense but is made merely for the purpose of describing the general principles of the invention. The scope of the invention should be ascertained with reference to the issued claims.

The present invention is believed to be applicable to a variety of systems, different devices, and data schemes which process information for communications over an analog channel. The invention has been found to be particularly advantageous in application environments where digital information is first processed and then converted to the analog domain and where power savings is an important consideration. While the present invention is not so limited, an appreciation of various aspects of the invention is best gained through a discussion of application examples operating in such an environment.

Figure 1:
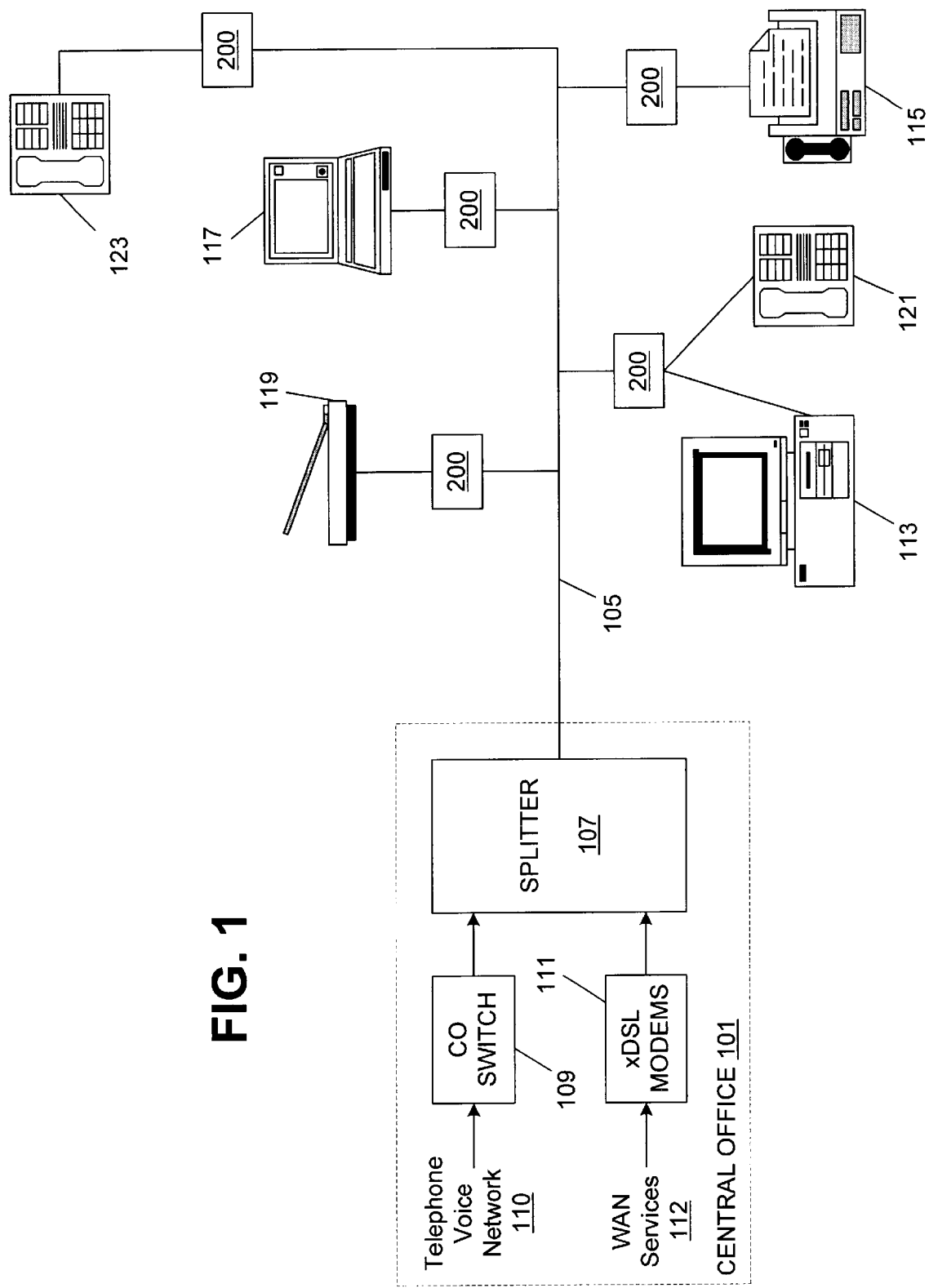
FIG. 1 is a diagram that sets forth an example that utilizes the amplifier circuit of the present invention.

FIG. 1 illustrates an example operating environment benefited by the power saving advantages of the present invention. In FIG. 1, the central office 101 of a telephone company or service provider is coupled to a customer premise via a digital subscriber line 105. The central office 101 provides out of band data transfers to the customer premise 103 via the digital subscriber line 105. In the illustrated example, xDSL (representing one of many types of Digital Subscriber Lines) data transmission technology is used. The central office 101 includes a splitter 107 (or its digital equivalent) which is coupled to the subscriber line 105. The splitter 107 is coupled to a standard switched telephone network 110 via a central office switch 109. The central office 101 also includes a bank of xDSL modems 111 which are used to communicate data band signals over the subscriber line 105. The xDSL modems 111 are coupled to a wide area network (WAN) 112, for example. The splitter 107 separates voice and data band signals from the subscriber line 105 and provides the respective signals to the central office switch 109 and xDSL modems 111. The splitter 107 also combines voice and data band signals received from the central office switch 109 and xDSL modems 111 and provides the combined signals to the subscriber line 105.

The customer premise 103 includes a number of battery and/or AC powered customer devices, each coupled to an internal telephone wire network. The customer premise devices depicted in FIG. 1 include a personal computer 113, a fax machine 115, a laptop computer 117, a printer 119, and telephones 121, 123. The customer devices depicted in FIG. 1 generally fall into one of the following two categories.

The first category includes voice devices such as conventional telephones 121, 123 and fax machines 115. These devices use signals in the voice band to communicate with other devices adapted for voice band communication. For example, a telephone 121 at the customer premise 103 may be connected to a remote telephone 123 via an internal telephone wire network 125, the subscriber line 105, the central office switch 109, and the standard public switched telephone network (PSTN) (not shown).

The second category of customer devices includes data devices such as personal computers 113, laptop computers 117, printers 119, and the like. The devices communicate using the data band. They also may communicate remotely with other data devices via the internal telephone wire network 125, the subscriber line 105, the xDSL modems 111 provided at the central office 101, and the WAN 112 connected to the xDSL modems 111. Certain customer devices may have the capability of communicating in both the voice and data bands. For example, a computer 113 may include a voice band modem and telephony software, such as a built-in speaker phone. When communicating with another voice band modem, or acting as a speaker phone, the computer 113 communicates in the voice band via the internal telephone network 125, the subscriber line 105, and the telephone voice network (not shown). The computer may also have a xDSL modem use to receive Internet services. The xDSL modem may communicate with the ISP via the internal telephone wire network 125, the subscriber line 105, and the xDSL modem 111 connected to the WAN 112 of the central office 101.

Interface arrangements 200 are provided at various points of device connection to the internal telephone wire network 125. The interface arrangements 200 couple data words (or groups) representing digital data and/or voice data from the corresponding devices to the internal telephone wire network 125 by amplifying an analog representation of the digital work using an amplifier powered at a level according to a value associated with a determined value of the digital word.

Figure 2:
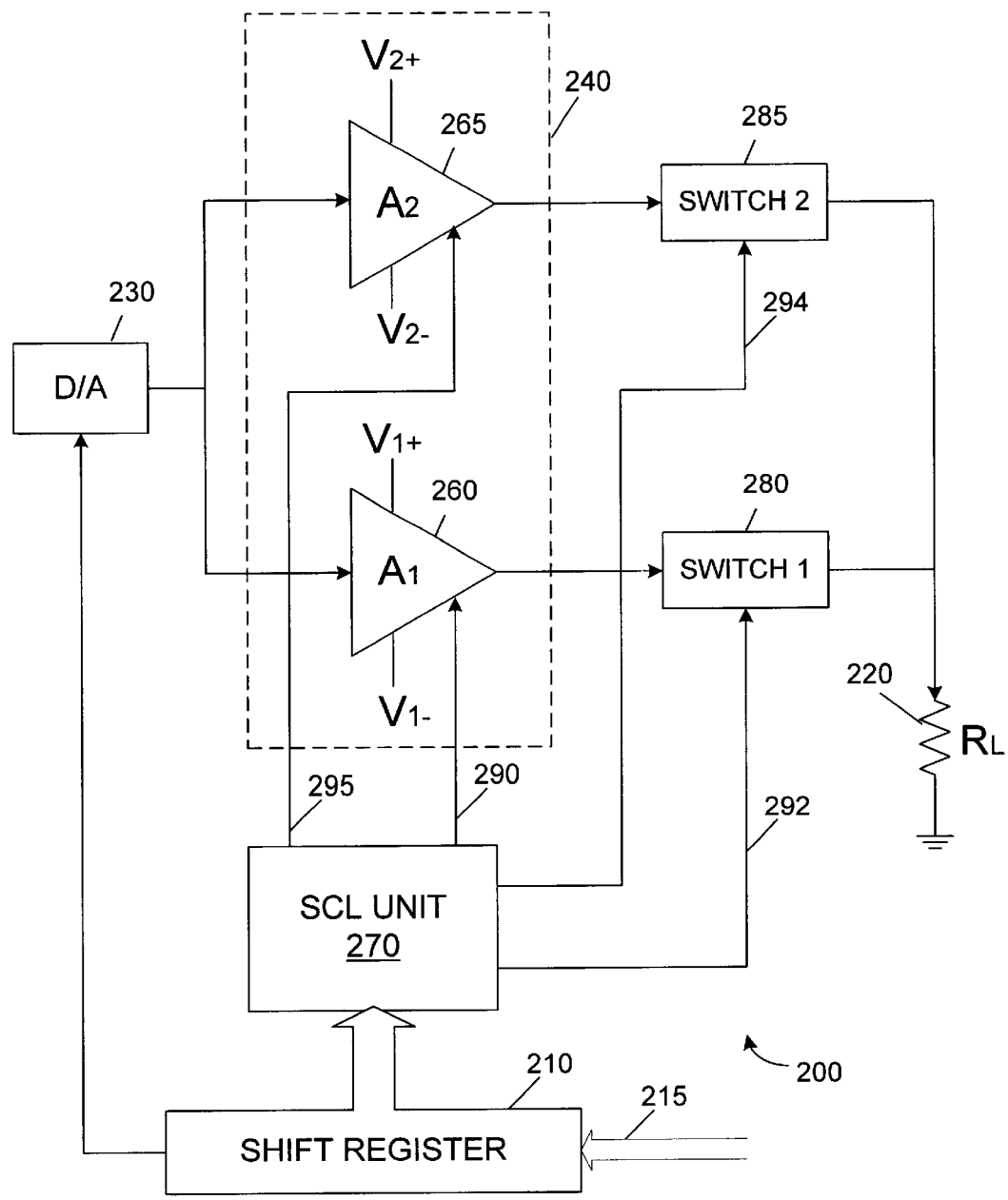
FIG. 2 is a schematic diagram that sets forth an example of the dynamically switched power amplifier of the present invention.

Reference is now made to FIG. 2, which is a schematic diagram of an interface arrangement 200, constructed in accordance with the present invention. In this regard, the diagram of FIG. 2 sets forth only one particular signal processing and amplifying circuit 200 (interface arrangement) that manipulates the supplied input stream 215 into data groups or data words for transmission over a communications channel 220. As shown, the circuit includes the following principal components: a shift register, a switched control logic (SCL) unit 270, a digital to analog converter 230, and a multi-stage, switched amplifier 240. Broadly, digital data arriving at the serial input stream is passed through the shift register 210 and fed to the digital to analog converter 230. The SCL unit 270 observes the digital data at some interim point as it is passing through the shift register 210. The SCL unit 270 uses this advanced knowledge to control the operation of the multi-stage amplifier circuit 240, in such a manner that the amplifier circuit 240 operates in a very power-efficient fashion. In this regard, the shift register sufficiently delays the digital signal (before it is passed to the digital to analog converter 230) so that the SCL unit 270 has time to adequately prepare the amplifier circuit 240 for the upcoming (anticipated) analog signal.

A central feature of the signal processing and amplifying circuit 200 is the multi-stage amplifier circuit 240. This circuit 240 includes multiple amplifiers An 260, 265 (where n is an integer). For simplicity, only two such amplifiers are illustrated in the diagram of FIG. 2. However, it will be appreciated that additional amplifiers may be utilized. Each amplifier has its own voltage source, of differing value (voltage level). By way of example, the first amplifier 260 may be powered by a relatively low-valued voltage source V1+, V1−, while the second amplifier 265 may be powered by a higher-valued voltage source V2+, V2−.

In the signal processing and amplifying circuit 200 of the present invention, as analog signals of relatively low magnitude are output from the digital to analog converter 230, an amplifier (e.g., amplifier 260) powered by a smaller voltage source is used to amplify the signal. In contrast, as analog signals of relatively high magnitude are output from the digital to analog converter 230, an amplifier (e.g., amplifier 265) powered by a larger voltage source is used to amplify the signal.

The SCL unit 270 operates to "select" an appropriate one of the plurality of amplifiers 260, 265 for amplifying a given analog signal. All remaining (unselected) amplifiers are "deselected." In this regard, the SCL unit 270 generates control signals 290 and 295 to enable and disable the amplifiers 260 and 265, respectively. By disabling unused amplifiers, the circuit 200 realizes a lower overall power consumption, and therefore greater power efficiency. The actual implementation of this "enabling" function could be extremely varied. One implementation could actually disconnect the power supplies using solid state or conventional relays. Other implementations could simply disable a current source or other biasing circuits contained within the amplifier circuit which would result in the amplifier being disabled in a manner that minimizes the power consumption of the circuit. Furthermore, as various amplifier implementations may require varying amounts of time to "re-enable" after being "disabled", the use of a shift register allows the SCL unit to identify peaks in the input signal with sufficient time to allow the various amplifier stages to be enabled "in time" for the peaks to be amplified correctly. Also, the SCL unit 270 can delay the actual connection of a recently enabled amplifier to the communications channel until such time as any turn-transients or DC components have subsided, thus minimizing the introduction of transients and spurious signals to the channel.

Switches 280 and 285 are interposed between the output of the amplifiers 260 and 265, respectively and the channel. The switches 280 and 285 are preferably solid state switches, but may take on a variety of other forms as well. The SCL unit 270 also generates control signals 292 and 294 for controlling the operation of the switches 280 and 285. When the SCL unit 270 operates to disable an amplifier stage, it will also operate to open the switch associated with that stage. Thus, if amplifier 260 is disabled by SCL unit 270, then SCL unit will also operate to open switch 280.

It should be appreciated that more than two stages of the amplifier circuit may be provided, consistent with the scope and spirit of the present invention. The efficiency of such a circuit should be apparent to one skilled in the art. By way of comparison, if a single amplifier were used, it must be powered by a relatively large voltage source. Otherwise, high valued input signals would drive the amplifier into saturation. However, low valued input signals are not as efficiently amplified, in such a system. Furthermore, the higher-valued power source places a higher constant power drain on the system.

In operation, a supplied digital signal 215 representing an analog signal to be transmitted to the communications channel 220 arrives at the shift register 210. The shift register 210 then assembles the serial stream into an 8 bit byte (although other sizes may be used consistent with the invention), which is applied to the input of the DAC 230. The length of the shift register 210 is chosen based upon the amount of "advance notice" that is required by the amplifiers 260, 265. Using the built in latency associated with the shift register 210, the SCL unit 270 has sufficient notice to enable and disable amplifiers 260, 265. The use of control signals 290, 295 as described above will result in the power amplifier entering a "cutoff state," during which the power consumption required by the circuit is minimal.

The power amplifier operates as follows: small amplitude signals that are entering the amplifier can best be handled by amplifier $A_1$ 260. This allows amplifier $A_1$ to use a smaller supply voltage and improves the efficiency of the amplifier. As the input signal increases, the 8 bit word being shifted through the shift register 210 increases. As a result, the SCL unit 270 recognizes that a large digital value is about to be placed as an input to the DAC 230. Accordingly, the SCL unit 270 knows that this large value would be to drive amplifier $A_1$ 260 into saturation or cutoff (a clipping condition). Prior to the arrival of the increased signal, the SCL unit 270 instructs amplifier $A_2$ 265 to enter the active region by activating the control signal 295. The SCL unit 270 allows sufficient time for amplifier $A_2$ 265 to stabilize and time for all transients resulting from the reactivation for amplifier $A_2$ 265 to subside before the switch 285 is activated, thus connecting the communications channel 220 to amplifier the output of $A_2$. The deactivation of the control line 290 prepares amplifier $A_1$ 260 for deactivation or power down. Prior to deactivating the amplifier $A_1$ 265, the switch S1 280 is opened, this disconnecting amplifier $A_1$ 265 from the communications channel 220.

Figure 3:
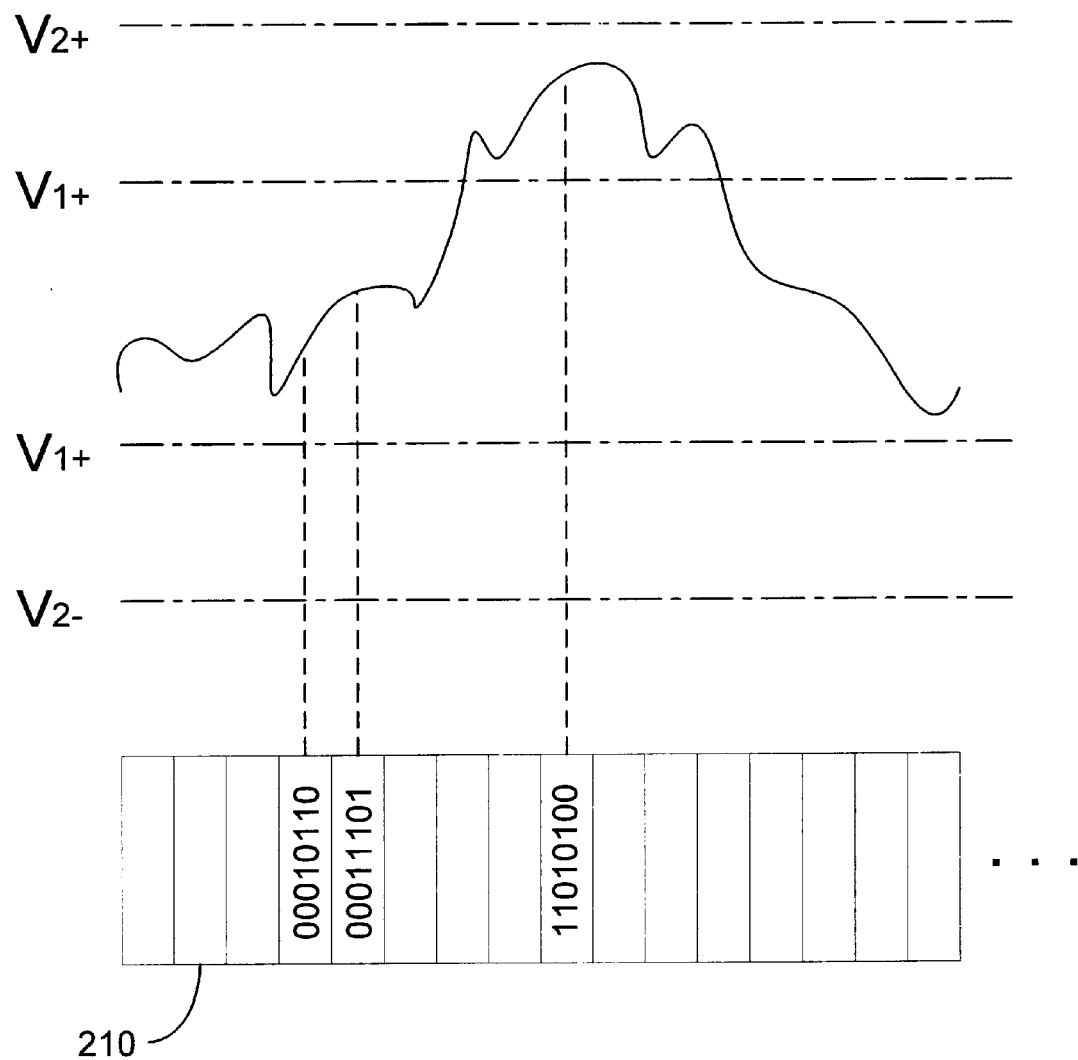
FIG. 3 illustrates the contents of the shift register dividing the digital signals into words that can be used with the present invention.

Reference is now made to FIG. 3, illustrates how values of a serial input stream 215 are stored in a shift register 210. Shown is the shift register containing 8 bit digital words which correspond to the serial input stream. These 8 bit words are then fed into the switch control logic and the D/A converter. The SCL unit 270 evaluates the 8 bit words to determine the analog signal amplitude. Based upon the anticipated signal amplitude, the SCL unit 270 opens/closes switches 280, 285 and enables/disables 290, 295 the amplifier stages 260, 265 to most efficiently amplify the analog signal. The DAC 230 converts the digital signal to analog.

Figure 4:
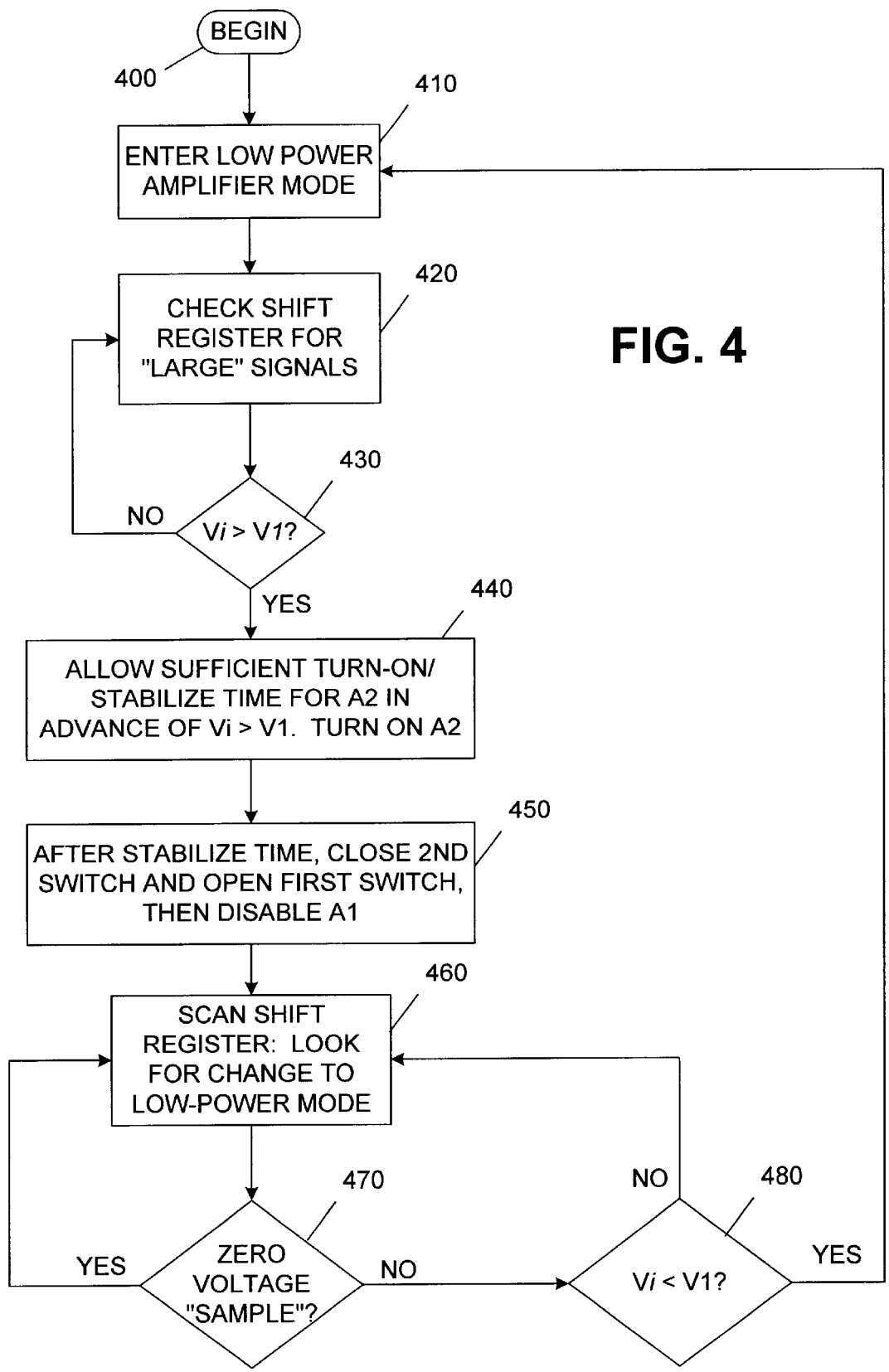
FIG. 4 is a flowchart illustrating the operation of the control logic usable with an embodiment of the present invention.

Reference is now made to FIG. 4, which is a flowchart illustrating one embodiment of the logic of the SCL unit 270. At the beginning, at step 400, the assumption is made that voltage gain is 1. Then, the switch control logic sets the amplifier in low power mode by setting control signal 290 to "1" and control signal 295 to "0" (Step 410). As this point, switch 280 is closed and switch 285 is opened. The SCL unit 270 checks the shift register for "large signals" (step 420). At step 430, the current voltage is compared to a threshold voltage (Vi). If the present voltage level is not larger than the threshold Vi, then the logic continues to monitor the shift register for large signals (step 420). If, however, the current voltage indicates a large signal, then the system proceeds to step 440, and the second amplifier 265 is turned on via setting control signal 295 to "1". This turns on the amplifier 265 a sufficient time before the "large signal" gets to the amplifier. Next, at step 450, the system enters a high power mode, and once the signal has stabilized, the SCL unit 270 closes switch 285 and opens switch 280. The control signal 290 is then set to "0" as the amplifier 260 enters a low-power (i.e., disabled) mode. At step 460, the SCL unit 270 then begins to monitor for a low voltage input signal to occur. A voltage level of zero in the shift register indicates that the in/out signal is passing through zero volts, which could be the right time to return the amplifier system to a "low power" mode. If, however, there are subsequent large peaks immediately following the zero voltage level contained in the shift register, the SCL could elect to keep the amplifier system in the higher power mode, rather than switching the amplifier system to low power more and returning it to high power mode in a very short period of time. This "intelligence" in the SCL could be implemented in a variety of ways including hard wired state machines and various soft technologies, including microprocssors, and other techniques. This intelligence provides hysteresis to the amplifier switching algorithm. 210 may be ignored by returning to step 460 (see step 470). Otherwise, the system proceeds to step 480, where the SCL unit 270 looks for a low voltage condition (i.e., $V_i > V_1$). It this condition is detected, then the amplifier returns to step 410, where it enters the low-power state (previously described).

The use of intelligent solid state switching technology minimizes the unavoidable cross over notch distortion that occurs when amplifiers first begin conducting current in the high current output stages of the amplifier. The switch control logic pauses until the amplifier is stabilizes, and the outputs of the two stages are coordinated in a way that allows one stage to take over without creating any crossover distortion or glitch energy associated with the changing of the amplifier.

Obviously, this technique can be extended to include any number of amplifier stages whose Vcc ratios are adjusted to best match the types of signals that injected into the amplifier. This increases the overall power efficiency of the amplifier system.

It will be appreciated that the SCL unit 270 may look at any interim point of the shift register. Further, this point may vary over time and circumstances. Further still, the SCL unit 270 may monitor more than one value (and indeed may monitor the entire contents of the shift register) to make more "intelligent" or complex decisions with regard to the control of the amplifier stages. In should further be appreciated that the present invention is not limited to any particular algorithm implemented by the SCL unit 270.

Although an exemplary embodiment of the present invention has been shown and described, it will be apparent to those of ordinary skill in the art that a number of changes, modifications, or alterations to the invention as described may be made, none of which depart from the spirit of the present invention. All such changes, modifications, and alterations should therefore be seen as within the scope of the present invention.

What is claimed is:

1. A signal processing and amplifying circuit comprising:
    a shift register configured to receive a stream of digital data, wherein the stream of digital data comprises a digital representation of an analog input signal;
    a digital to analog converter configured to receive digital data output from the shift register and convert the digital data to a delayed analog signal;
    a multi-stage amplifier circuit having an amplifier for each stage of the circuit, each amplifier of the multi-stage amplifier circuit positioned to receive the delayed analog signal output from the digital to analog converter and output a signal to a communication channel; and
    a state machine having an input disposed to receive the digital representation of the analog input signal from the shift register at an interim location between the input and output of the shift register, the state machine having circuitry for using the digital representation of the analog input signal to generate control outputs that enable an amplifier in the multi-stage amplifier circuit.

2. The signal processing and amplifying circuit as defined in claim 1, wherein each stage of the multi-stage amplifier further includes a switch serially interposed between an output of the amplifier for that stage and the communication channel.

3. The signal processing and amplifying circuit as defined in claim 2, wherein enabling the amplifier in the multi-stage amplifier circuit comprises controlling a state of each switch.

4. The signal processing and amplifying circuit as defined in claim 1, wherein the multi-stage amplifier is a two stage amplifier.

5. A signal processing and amplifying system for processing and amplifying a supplied digital signal, the supplied digital signal comprising a digital representation of an analog input signal, the system comprising:

a delay circuit that delays the supplied digital signal by a known amount;
    a converter connected to the delay circuit that converts the supplied digital signal into a delayed analog signal;
    an amplifier system connected to the converter that amplifies the delayed analog signal, wherein the amplifier system comprises a plurality of amplifiers configured in a parallel fashion such that each amplifier receives the delayed analog signal; and
    a controller connected to the delay circuit, the controller configured to route the delayed analog signal through an amplifier in the plurality of amplifiers, based upon processing the supplied digital signal to obtain an amplitude information of the analog input signal.

6. The system of claim 5, wherein the delay circuit is a shift register.

7. The system of claim 6, wherein the amplifier system comprises at least two amplifiers, wherein the first amplifier outputs a first amplified signal, and the second amplifier outputs a second amplified signal.

8. The system of claim 7, wherein the converter is a digital to analog converter.

9. The system of claim 5, wherein routing the delayed analog signal through the amplifier comprises operating a switch.

10. The system of claim 9, wherein the switch comprises a solid state switch.

11. A method of amplifying a signal with an amplifying system, the method comprising:
    receiving a digital signal that is a digital representation of an analog input signal;
    processing the digital signal to obtain an amplitude information of the analog input signal;
    using the amplitude information to enable an amplifier among a plurality of amplifiers;
    delaying the digital signal;
    converting the delayed digital signal into a delayed analog signal; and
    amplifying the delayed analog signal using the enabled amplifier.

12. The method of claim 11, further comprising using the amplitude information to disable an amplifier among the plurality of amplifiers.

13. A method for optimizing power consumption in an amplifier system, the method comprising:
    providing a digital input signal that is a digital representation of an analog input signal;
    using the digital input signal to determine a signal amplitude of the analog input signal;
    selecting a first amplifier among a plurality of amplifiers, the first amplifier being configured to accommodate the signal amplitude of the analog input signal;
    de-selecting a second amplifier among the plurality of amplifiers so as to minimize power consumption in the amplifier system;
    generating a delayed digital signal by delaying the digital input signal;
    converting the delayed digital signal into a delayed analog input signal;
    providing the delayed analog input signal to the first amplifier; and
    generating an analog output signal from the first amplifier.

14. The method of claim 13, wherein the first amplifier is provided with a first power-supply voltage that has an amplitude greater than a peak signal amplitude of the analog input signal, and wherein the second amplifier is provided with a second power-supply voltage that has an amplitude less than the peak signal amplitude of the analog input signal.

15. The method of claim 13, wherein the first and second amplifiers are provided with a power-supply voltage that is connected in common to both amplifiers, and wherein de-selecting the second amplifier comprises disconnecting the power-supply voltage connection to the second amplifier.

16. The method of claim 13, wherein selecting the first amplifier comprises operating at least one of a first switch that is interposed in an input connection into the first amplifier and a second switch that is interposed in an output connection of the first amplifier.

17. The method of claim 16, wherein the first switch is operated at a first instance of time with reference to the peak signal amplitude of the analog input signal, and the second switch is operated at a second instance of time with reference to the peak signal amplitude of the analog input signal.

18. The method of claim 17, wherein the first instance of time is the same as the second instance of time.

19. The method of claim 13, wherein de-selecting the second amplifier comprises operating at least one of a first switch that is interposed in an input connection into the second amplifier and a second switch that is interposed in an output connection of the second amplifier.

20. The method of claim 19, wherein the first switch is operated at a first instance of time with reference to the peak signal amplitude of the analog input signal, and the second switch is operated at a second instance of time with reference to the peak signal amplitude of the analog input signal.

21. The method of claim 20, wherein the first instance of time is the same as the second instance of time.

22. An amplifier system having optimal power consumption, the system comprising:

delay means configured to receive a stream of digital data, wherein the stream of digital data comprises a digital representation of an analog input signal, and to generate a delayed digital data output;

converter means configured to receive the delayed digital data output from the delay means and convert the delayed digital data output to a delayed analog signal;

amplifying means comprising a plurality of amplifiers, each amplifier configured to receive the delayed analog signal from the converter means; and control means configured to receive at least a portion of the stream of digital data, process the portion of the stream of digital data to obtain a signal amplitude information of the analog input signal, and use the signal amplitude information to select a first one of the plurality of amplifiers and to de-select a second one of the plurality of amplifiers for providing optimal power consumption of the amplifier system.

23. The amplifier system of claim 12, wherein the control means is configured to receive the portion of the stream of digital data from the delay means.

24. The amplifier system of claim 12, wherein the delay means comprises a shift register.

25. The amplifier system of claim 12, wherein the converter means comprises a digital-to-analog converter.

26. The amplifier system of claim 12, wherein the plurality of amplifiers are connected in a parallel connection; and de-selecting the second one of the plurality of amplifiers comprises disconnecting the second amplifier from the parallel connection.

* * * * *